United States Patent [19]
Harpin et al.

[11] Patent Number: 5,881,190
[45] Date of Patent: Mar. 9, 1999

[54] ASSEMBLY OF AN OPTICAL COMPONENT AND AN OPTICAL WAVEGUIDE

[75] Inventors: Arnold Peter Roscoe Harpin, Oxford; Andrew George Rickman, Marlborough; Robin Jeremy Richard Morris, Oxford, all of United Kingdom

[73] Assignee: Bookham Technology Limited, United Kingdom

[21] Appl. No.: 853,104

[22] Filed: May 8, 1997

[30] Foreign Application Priority Data

May 16, 1997 [GB] United Kingdom .................... 9610275

[51] Int. Cl.[6] ...................................................... G02B 6/30
[52] U.S. Cl. ................................ 385/49; 385/14; 385/130
[58] Field of Search ................................... 385/15, 2, 14, 385/39, 49, 52, 50, 129, 130, 131, 132; 372/7, 43, 50

[56] References Cited

U.S. PATENT DOCUMENTS

| | | | |
|---|---|---|---|
| 4,997,246 | 3/1991 | May et al. | 385/2 |
| 5,163,118 | 11/1992 | Lorenzo et al. | 385/132 |
| 5,488,678 | 1/1996 | Taneya et al. | 358/14 |

*Primary Examiner*—Phan T.H. Palmer
*Attorney, Agent, or Firm*—Webb Ziesenheim Bruening Logsdon Orkin & Hanson, P.C.

[57] ABSTRACT

A silicon-on-insulator chip has a location recess formed therein for receiving a laser diode. The location recess includes two non-parallel location surfaces adapted to abut against two reference surfaces formed on the laser diode. The abutment of the location surfaces against the reference surfaces enables a laser emission area of the laser diode to be accurately aligned with a rib waveguide formed on the silicon-on-insulator substrate.

13 Claims, 2 Drawing Sheets

ASSEMBLY OF AN OPTICAL COMPONENT AND AN OPTICAL WAVEGUIDE

BACKGROUND

This invention relates to an assembly of an optical component and an optical waveguide positioned in accurate alignment with each other so as to provide a low loss coupling therebetween.

It is of importance, particularly in the field of optical communications, to provide low loss couplings between an optical component such as a laser diode or a photodiode with an optical waveguide. Such low loss couplings are generally achieved by positioning the optical component with the optical waveguide in accurate alignment with each other (within 0.1 micron both horizontally and vertically). However, with known methods of achieving this, it is either difficult to provide the required accuracy or expensive, high tolerance apparatus is required to form the assembly.

There thus remains a need for a relatively simple, low cost method of providing alignment of an optical component with a waveguide to the required accuracy.

SUMMARY OF THE INVENTION

According to a first aspect of the present invention, there is provided an assembly of an optical component and an optical waveguide positioned in alignment with each other on a silicon-on-insulator chip which comprises a layer of silicon separated from a substrate by a layer of insulating material, the assembly comprising: a location recess formed in the silicon-on-insulator chip for receiving the optical component the location recess having at least two non-parallel location surfaces; a waveguide formed or mounted on the chip in known alignment with the said location surfaces, and an optical component having at least two reference surfaces mounted in the location recess so that each of said reference surfaces abuts against a respective one of the said location surfaces, the location recess being formed such that the position of one of the location surfaces therein is determined by the position of an interface of said layer of insulating material.

According to a second aspect of the invention there is provided a method of aligning an optical component and an optical waveguide on a silicon-on-insulator chip which comprises a layer of silicon separated from a substrate by a layer of insulating material, the method comprising the steps of: forming a location recess in the silicon-on-insulator chip, the location recess being provided with at least two non-parallel location surfaces, the position of one of the location surfaces being determined by the position of an interface of said layer of insulating material; forming or mounting an optical waveguide on the chip in known alignment with the said location surfaces; and mounting an optical component having at least two reference surfaces in the location recess such that each of said reference surfaces abuts against a respective one of the said location surfaces.

According to a further aspect of the invention there is provided an assembly comprising an optical component and an optical waveguide which have been positioned in alignment with one another by a method as detailed above.

Other features of the invention will be apparent from the following description and from the subsidiary claims of the specification The invention will now be further described, merely by way of example, with reference to the accompanying drawings, in which:

DETAILED DESCRIPTION OF THE PREFERRED EMBODIMENTS

Figure 1:
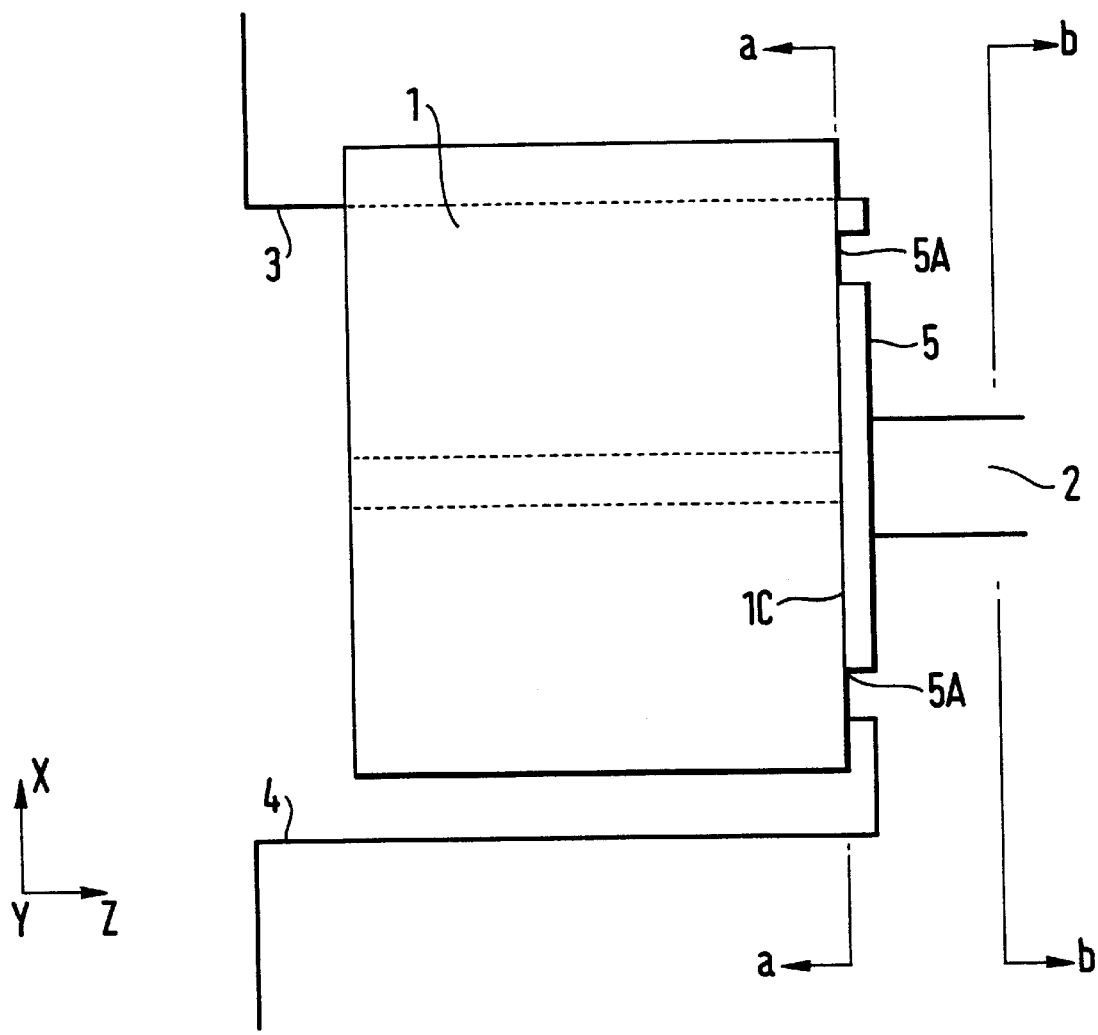
FIG. 1 shows a plan view of an assembly of a laser diode and optical wave guide according to one embodiment of the invention.

FIG. 1 shows an assembly comprising a laser diode 1 which is accurately aligned with an optical waveguide 2, which is in the form of a rib waveguide, so as to provide a low loss coupling therebetween (preferably less than 1–3dB loss). The assembly is formed on a silicon-on-insulator chip. The laser diode 1 is positioned within a recess formed in the silicon-on-insulator chip, the recess being defined by side walls 3 and 4, an end wall 5 and a base support 6.

Figure 2A:
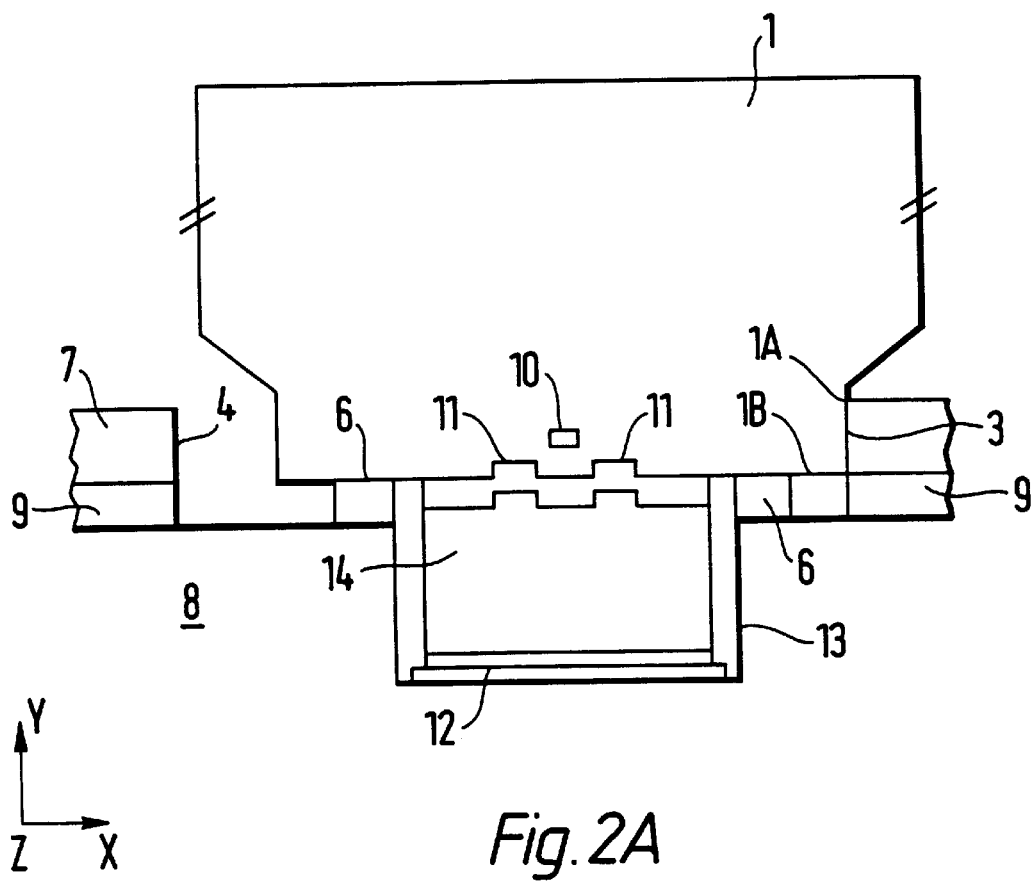
FIG. 2A shows a cross-sectional view of the assembly shown in FIG. 1 taken along Line a—a.
Figure 2B:
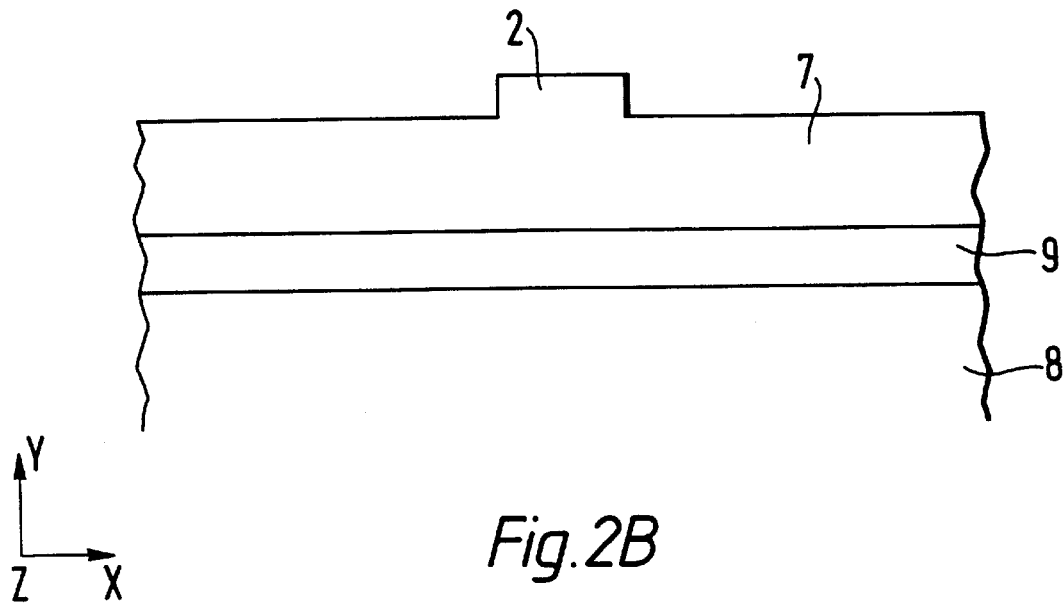
FIG. 2B shows a cross-sectional view thereof taken along line b—b.

As shown in FIGS. 2A and 2B, the silicon-on-insulator chip comprises an upper layer of silicon 7, separated from a silicon substrate 8 by a layer of insulating material 9, in this case silicon dioxide.

FIG. 2B shows a cross-section through the rib waveguide 2. Such rib waveguides formed on a silicon-on-insulator chip are known and described further in WO 95/08787 and other references given therein. Such waveguides typically have a cross-section of around 2×4 microns, but larger cross-sections, e.g. 10×10 microns are possible.

Lateral alignment (in the direction of the X-axis) of the laser diode 1 with the rib waveguide 2 is provided by abutment of a side surface 1A of the laser diode 1 against the side wall 3 of the recess (as shown in FIG. 2A). Vertical alignment (in the direction of the Y-axis) is provided by abutment of a side surface 1B the laser diode 1 against the base support 6 of the recess which, as shown in FIG. 2A, is provided by a platform formed in the silicon dioxide layer 9 on either side of the recess. In the arrangement shown, the side wall 3 and base support 6 are substantially perpendicular to each other and each lies substantially parallel to the optic axis of the waveguide 2 (which lies along the Z-axis). Other arrangements are, however, possible.

The laser diode 1 is also preferably aligned in the direction of the Z-axis by abutment of a side surface 1C of the laser diode against projections 5A provided on the end wall 5 of the recess so as to accurately determine the spacing between the laser diode 1 and the rib waveguide 2.

It will be appreciated that prior to fabrication of the assembly described above, it is necessary to form surfaces 1A and 1B of the laser diode such that their positions in the X–Y directions relative to the laser emission area 10 are accurately known (e.g. to within 0.1 micron). Surfaces 1A and 1B thus act as reference surfaces which, when abutted against wall 3 and base support 6 of the recess, respectively, ensure accurate alignment of the laser emission area 10 with the rib waveguide 2 so as to provide a low loss coupling therebetween.

FIG. 2A also shows electrical contacts 11 on the base of the laser diode 1. These are connected to a metal contact pad and heat sink 12 provided at the bottom of a further recess 13 provided in the base of the location recess by means of solder or other conductive material 14.

It should also be noted that the location recess is non-symmetric relative to the rib waveguide 2 in that the side wall 4 of the recess is positioned so that the recess is approximately 10 microns wider than the laser diode 1. The laser diode 1 can thus be positioned within the location recess by low tolerance placement machinery. It is then butted up against the side wall 3 to provide accurate positioning in the X-direction.

A typical laser diode has dimensions in the order of 350 microns×300 microns with an emission area typically a few microns wide, e.g. 2×4 microns or 3×8 microns. The size of the emission area and of the waveguide should preferably be matched so as to minimise losses therebetween or a size matching device used therebetween.

An advantage of the method of alignment described above is that the positions of the optical waveguide 2 and the side wall 3 can be defined by a single masking step and so are automatically formed in the desired positions relative to each other without the need for accurate alignment of subsequent masking steps.

An important feature of the assembly described is that alignment of the laser diode 1 in the vertical (Y-axis) direction, is determined by the silicon dioxide layer 9. In the arrangement shown, this is determined by abutment of the laser diode against a surface of the silicon dioxide layer.

The arrangement shown in FIG. 2A can be formed by using an etchant which removes the desired parts of the upper layer of silicon 7 but does not attack the silicon dioxide layer 9. The upper surface of the oxide layer 9 thus acts as a natural etch stop so the position of the base 6 of the recess is thus accurately determined.

In an alternative arrangement, the lower surface of the silicon dioxide layer 9, i.e. the interface between the oxide layer and the underlying silicon substrate 8, may be used to define the position of the base 6 of the recess. In this case, once the upper layer of silicon 7 has been removed, an etchant is used which removes the desired parts of silicon dioxide layer but which does not attack the underlying silicon substrate 8. The interface between the silicon dioxide layer 9 and the underlying silicon substrate thus acts as a natural etch stop so the position of the base 6 of the recess is thus accurately determined.

It will be appreciated that in both of the cases described above, a surface of the silicon dioxide layer 9, the position and thickness of which are well defined, is used to determine the position of the base 6 of the recess.

As shown in FIG. 1, the location recess is preferably provided at an edge of the chip so that one end of the location recess is open. The metal contact pad 12 is thus accessible for connection to electrical wires.

Methods of fabricating an assembly as described above and as shown in FIGS. 1 and 2 will be known to those skilled in the art but the following features are highlighted:

The assembly is preferably formed from standard SIMOX (silicon-on-insulator) material which typically comprises 5 microns of silicon on a 0.4 micron thick buried oxide layer which is supported on a silicon substrate. The waveguide 2 formed in the silicon layer is typically about 2 microns high×4 microns wide (in cross-section).

As mentioned above, the rib waveguide and the location recess are preferably defined photolithographically in the surface oxide by a single masking step. This automatically ensures alignment between the location recess and waveguide as the positions of both are defined by the same mask.

Due to the high selectivity between oxide and silicon, either surface of the buried oxide layer can act as an etch stop, thus allowing accurate definition of the depth of the recess and hence the height of the laser diode relative to the waveguide The buried oxide layer is preferably etched into the form of narrow strips forming a U-shape to minimise the area of the buried oxide layer which contacts the laser diode.

The end facet of the waveguide is preferably provided with an anti-reflective coating such as silicon nitride which is substantially unaffected by the silicon etchant. The end facet may also be inclined so that it is not perpendicular to the optical axis of the waveguide in order to remove and control back reflection, and may also be made convex or some other shape for similar reasons.

The assembly has been described above in relation to the mounting of a light emitter in the form of a laser diode in alignment with an optical waveguide. Other optical components, e.g. a photodiode or semiconductor optical amplifier, for receiving and/or emitting radiation, may be aligned with an optical waveguide in a similar manner.

The assembly has also been described above in relation to the mounting of an optical component in alignment with an integrated optical waveguide. Other optical waveguides guides, such as optical fibres, may also be used. In this case, the optical fibre would typically be located in a V-groove formed on the chip, the location of the V-groove being defined in the same masking step used to define the location recess so as to be automatically aligned therewith.

We claim:

1. An optical assembly for use in optical communication, the optical assembly comprising:

a silicon-on-insulator chip having a layer of silicon separated from a substrate by a layer of insulating material;

a location recess formed in the silicon-on-insulator chip, with the location recess having two non-parallel location surfaces, with one location surface defined by a surface of the layer of insulating material opposite the substrate and with the other location surface defined by the layer of silicon;

an optical waveguide which is one of formed and mounted on the silicon-on-insulator chip, with the optical waveguide having an optical axis which extends parallel to the two location surfaces; and an optical component having an optical axis and two reference surfaces which are received in the location recess so that one reference surface abuts the one location surface and the other reference surface abuts the other location surface whereby the optical axis of the optical component and the optical axis of the optical waveguide are aligned with each other.

2. The optical assembly as set forth in claim 1, wherein:

the layer of insulating material within the location recess is formed into at least two strips;

each strip has a surface opposite the substrate; and the surface of each strip defines a part of the one location surface.

3. The optical assembly as set forth in claim 2, further including:

another recess formed in the substrate between the at least two strips;

a contact pad positioned in the other recess;

at least one electrical contact positioned on the optical component; and a conductive material received between the contact pad and the electrical contact and forming an electrical contact therebetween.

4. The optical assembly as set forth in claim 1, wherein:

the location recess includes a third location surface which is non-parallel with the two non-parallel location surfaces;

the optical component has a third reference surface; and the third reference surface and the third location surface abut, thereby setting a spacing between the optical component and the optical waveguide.

5. The optical assembly as set forth in claim 4, further including a projection formed on one of the third location surface and the third reference surface wherein the projection is positioned between the third reference surface and the third location surface for setting the spacing between the optical component and the optical waveguide.

6. The optical assembly as set forth in claim 1, wherein the two location surfaces are perpendicular to each other.

7. The optical assembly as set forth in claim 1, wherein the other location surface extends between the layer of insulating material and a surface of the layer of silicon opposite the layer of insulating material thereby forming a side wall of the location recess.

8. An optical assembly for use in optical communication, the optical assembly comprising:

a silicon-on-insulator chip having a layer of silicon separated from a substrate by a layer of insulating material;

a location recess formed in the silicon-on-insulator chip, with the location recess having two non-parallel location surfaces, with one location surface defined by a surface of the substrate co-planar with an interface between the substrate and the layer of insulating material and with the other location surface defined by the layer of silicon;

an optical waveguide which is one of formed and mounted on the silicon-on-insulator chip, with the optical waveguide having an optical axis which extends parallel to the two location surfaces; and an optical component having an optical axis and two reference surfaces which are received in the location recess so that one reference surface abuts the one location surface and the other reference surface abuts the other location surface whereby the optical axis of the optical component and the optical axis of the optical waveguide are aligned with each other.

9. The optical assembly as set forth in claim 8, wherein the other location surface extends between (i) the surface of the substrate co-planar with an interface between the substrate and the layer of insulating material, and (ii) a surface of the layer of silicon opposite the layer of insulating material thereby forming a side wall of the location recess.

10. The optical assembly as set forth in claim 9, further including:

another recess formed in the one location surface adjacent the other location surface;

a contact pad positioned in the other recess;

at least one electrical contact positioned on the optical component; and a conductive material received between the contact pad and the electrical contact and forming an electrical contact therebetween.

11. The optical assembly as set forth in claim 8, wherein:

the location recess includes a third location surface which is non-parallel with the two non-parallel location surfaces;

the optical component has a third reference surface; and the third reference surface and the third location surface abut, thereby determining a spacing between the optical component and the optical waveguide.

12. The optical assembly as set forth in claim 11, further including a projection formed on one of the third location surface and the third reference surface, wherein the projection is positioned between the third reference surface and the third location surface for setting the spacing between the optical component and the optical waveguide.

13. The optical assembly as set forth in claim 8, wherein the two location surfaces are perpendicular.

* * * * *

UNITED STATES PATENT AND TRADEMARK OFFICE
CERTIFICATE OF CORRECTION

PATENT NO.  : 5,881,190
DATED       : March 9, 1999
INVENTOR(S) : Arnold Peter Roscoe Harpin et al.

It is certified that error appears in the above-identified patent and that said Letters Patent is hereby corrected as shown below:

Column 1 Line 64 after "specification" insert period --.--.

Column 1 between lines 64-65 insert --BRIEF DESCRIPTION OF THE DRAWINGS--.

Column 2 Line 1 delete --BRIEF DESCRIPTION OF THE DRAWINGS--.

Signed and Sealed this

Twentieth Day of July, 1999

Attest:

Attesting Officer

Q. TODD DICKINSON

Acting Commissioner of Patents and Trademarks